(12) United States Patent
Chen et al.

(10) Patent No.: US 7,110,264 B2
(45) Date of Patent: Sep. 19, 2006

(54) MOUNTING APPARATUS FOR CIRCUIT BOARD

(75) Inventors: Yun-Lung Chen, Tu-Cheng (TW); Ye-Guo Xie, Shen-Zhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 84 days.

(21) Appl. No.: 11/013,144

(22) Filed: Dec. 14, 2004

(65) Prior Publication Data

US 2005/0190546 A1 Sep. 1, 2005

(30) Foreign Application Priority Data

Feb. 28, 2004 (CN) ........................ 2004 2 0432350

(51) Int. Cl.
*H05K 7/12* (2006.01)
*H05K 7/14* (2006.01)

(52) U.S. Cl. ...................... 361/801; 361/726; 361/732; 361/740; 361/747; 361/759; 361/807; 174/138 G

(58) Field of Classification Search ................ 361/726, 361/732, 740, 747, 759, 801, 807–810; 174/138 D, 174/138 E, 138 G; 312/216

See application file for complete search history.

(56) References Cited

U.S. PATENT DOCUMENTS

| | | | |
|---|---|---|---|
| 5,490,038 A * | 2/1996 | Scholder et al. ............. 361/759 |
| 5,691,504 A * | 11/1997 | Sands et al. ............... 174/35 R |
| 5,754,396 A * | 5/1998 | Felcman et al. ............. 361/683 |
| 6,151,209 A * | 11/2000 | Lee et al. .................... 361/683 |
| 6,205,020 B1 * | 3/2001 | Felcman et al. ............. 361/683 |
| 6,362,978 B1 * | 3/2002 | Boe ........................... 361/825 |
| 6,385,051 B1 * | 5/2002 | Perez et al. .................. 361/759 |
| 6,470,555 B1 | 10/2002 | Boe |
| 6,771,516 B1 * | 8/2004 | Leman et al. ................ 361/825 |
| 6,934,162 B1 * | 8/2005 | Perez et al. .................. 361/759 |
| 6,937,476 B1 * | 8/2005 | Chen et al. .................. 361/756 |
| 6,982,878 B1 * | 1/2006 | Chen et al. .................. 361/801 |

* cited by examiner

*Primary Examiner*—Kamand Cuneo
*Assistant Examiner*—Dameon E. Levi
(74) *Attorney, Agent, or Firm*—Morris Manning & Martin; Tim Tingkang Xia, Esq.

(57) ABSTRACT

A mounting apparatus for mounting a motherboard (30) having several first mounting holes (33) includes a chassis (10), a fixing member (70), and a supporting tray (50). The chassis comprised a post (24) protruding from a bottom wall (12) thereof, and a number of standoffs (18) received in first the mounting hole. The fixing member is slidably mounted to the post, and includes an engaging portion (82) protruding from a lower portion thereof. The supporting tray is attached to the motherboard, and includes a slice (66) projecting from a side portion thereof. When the engaging portion of fixing member engages with the slice of supporting tray, the motherboard is in a locked state; when the engaging portion of fixing member disengages from the slice of supporting tray, the motherboard is in an unlocked state.

17 Claims, 5 Drawing Sheets

MOUNTING APPARATUS FOR CIRCUIT BOARD

CROSS-REFERENCE TO RELATED APPLICATIONS

This application is related to a U.S. patent application entitled "MOUNTING APPARATUS FOR CIRCUIT BOARDS", recently filed with the same assignee as the instant application and with the Ser. No. 10/930338. The disclosure of the above identified application is incorporated herein by reference.

BACKGROUND OF THE INVENTION

1. Field of the Invention

The present invention relates to mounting apparatuses for circuit board, and particularly to a mounting apparatus that readily attach a circuit board onto a computer chassis.

2. Description of Related Art

For many years, the conventional method of installing a circuit board, such as a motherboard, in a computer was to simply fastener the motherboard on a chassis of the computer. This motherboard installation method substantially increases the time and the cost because of the complexity and difficulty of assembled or disassembled.

A relatively recent improvement in the mounting of a motherboard in a computer is illustrated and described in U.S. Pat. No. 5,754,396. In this patent, the motherboard is mounted to a projection structure that can be slid into and out of a computer chassis to install and later remove the motherboard for access and service purpose.

While this projection structure hastens and reduces the cost associate with initially installing the motherboard in the chassis and subsequently removing the motherboard for service and replacement, it also increases the manufacturing cost of the computer since a configuration of the projection structure is complex.

A new mounting apparatus for circuit board that overcomes the above-mentioned problems is desired.

SUMMARY OF THE INVENTION

An object of the present invention is to provide a mounting apparatus which readily attaches a circuit board onto a chassis.

In order to achieve the above object, a mounting apparatus for mounting a motherboard having a plurality of first mounting holes comprises a chassis, a fixing member, and a supporting tray. The chassis comprises a post protruding from a bottom wall thereof, and a plurality of standoffs received in the first mounting holes. The fixing member is slidably mounted to the post, and includes a engaging portion protruding from a lower portion thereof. The supporting tray is attached to the motherboard, and includes a slice projecting from a side portion thereof. When the engaging portion of fixing member engages with the slice of supporting tray, the motherboard is in a locked state; when the engaging portion of fixing member disengages from the slice of supporting tray, the motherboard is in an unlocked state.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
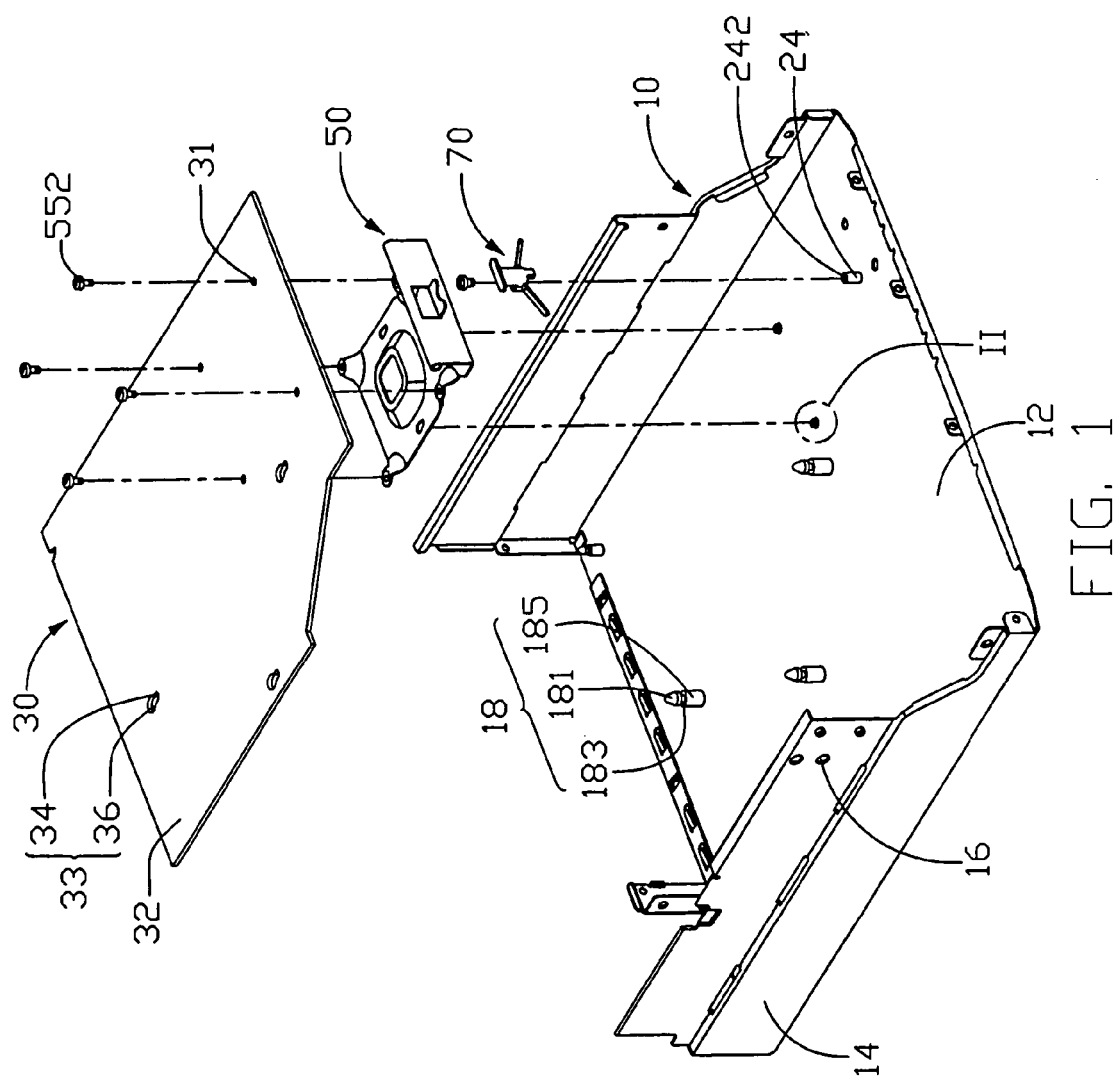
FIG. 1 is an exploded, isometric view of a mounting apparatus in accordance with a preferred embodiment of the present invention, together with a motherboard.
Figure 2:
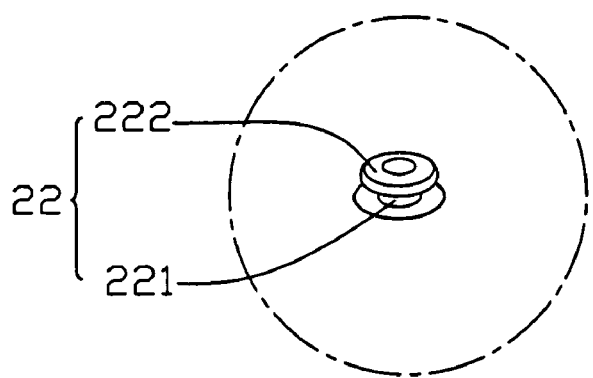
FIG. 2 is an enlarged view of an encircled portion II, showing a fastener.

FIG. 1 shows a mounting apparatus in accordance with the preferred embodiment of the present invention, together with a circuit board such as a motherboard 30. The mounting apparatus comprises a chassis 10 of an electronic device, a supporting tray 50 and a fixing member 70.

The motherboard 30 is mounted to the chassis 10. The motherboard 30 has a generally planar, rectangular substrate body 32. The substrate body 32 defines a plurality of first mounting holes 33 therethrough, and several through holes 31 near an end thereof. Each first mounting hole 33 is generally calabash-shaped. The first mounting hole 33 has a first narrow portion 36, and a first broad portion 34.

The chassis 10 has a bottom wall 12. The bottom wall 12 has a plurality of upstanding standoffs 18 corresponding to the first mounting holes 33 of the motherboard 30, respectively. Each standoff 18 includes cylindrical base portion 185, a generally conically shaped upper end portion 181, and an intermediate neck portion 183 formed between the base portion 185 and the end portion 181. A diameter of the end portion 181 is smaller than that of the first broad portion 34 of the first mounting hole 33, and is greater than that of the first narrow portion 36 of the first mounting hole 33. A pair of fasteners 22 protrudes from the bottom wall 12 for retaining the supporting tray 50. Each fastener 22 has a cap portion 222, and a post portion 221. A post 24 projects from the bottom wall 12 for mounting the fixing member 70. The post 24 has a threaded hole 242 defined in a center of an upper portion thereof.

Figure 3:
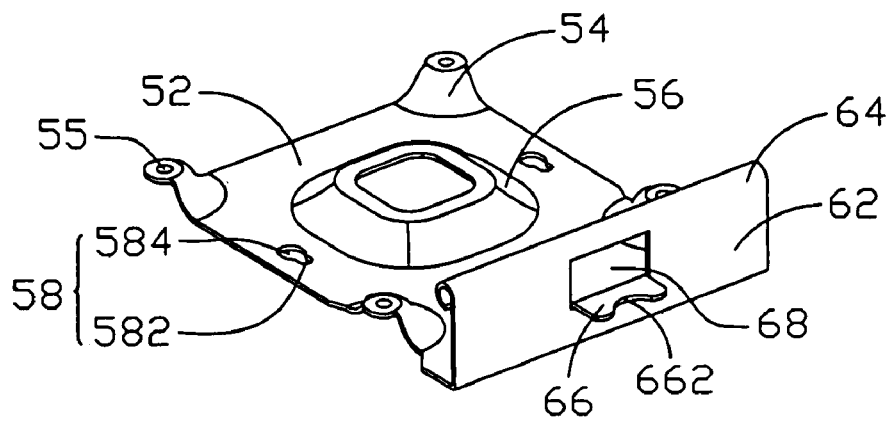
FIG. 3 is an enlarged view of a supporting tray of the mounting apparatus of FIG. 1.
Figure 4:
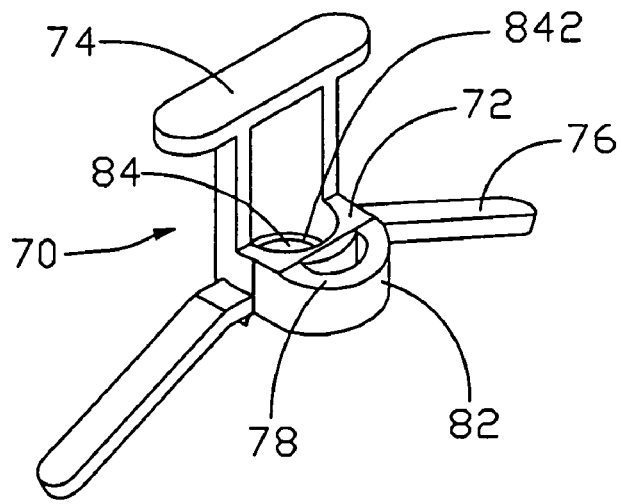
FIG. 4 is an enlarged, assembled view of a fixing member of FIG. 1, but viewed from another aspect.
Figure 5:
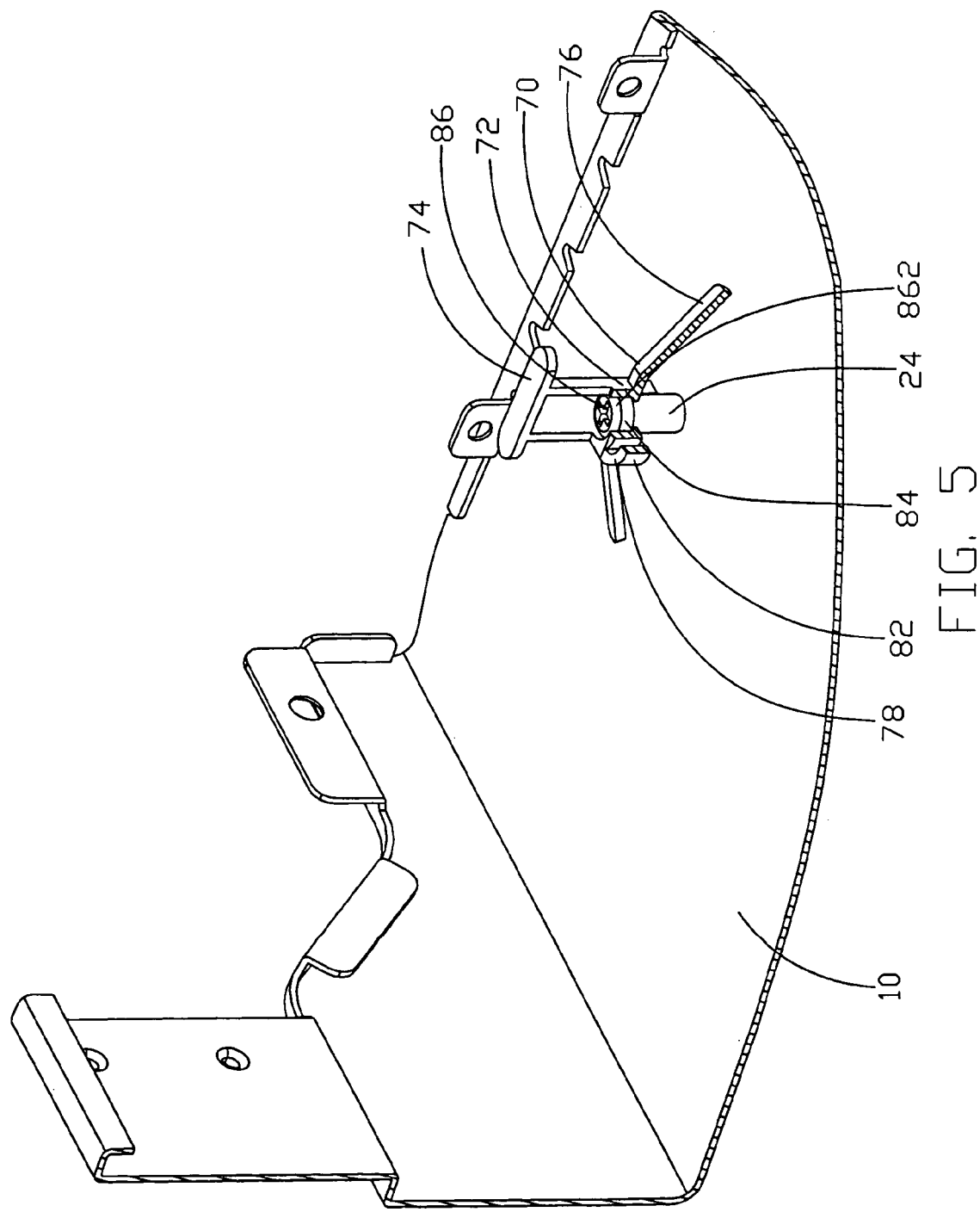
FIG. 5 is an assembled view of the fixing member and a chassis of the mounting apparatus of FIG. 1, but viewed from another aspect, and partly cut off for better illustration.
Figure 6:
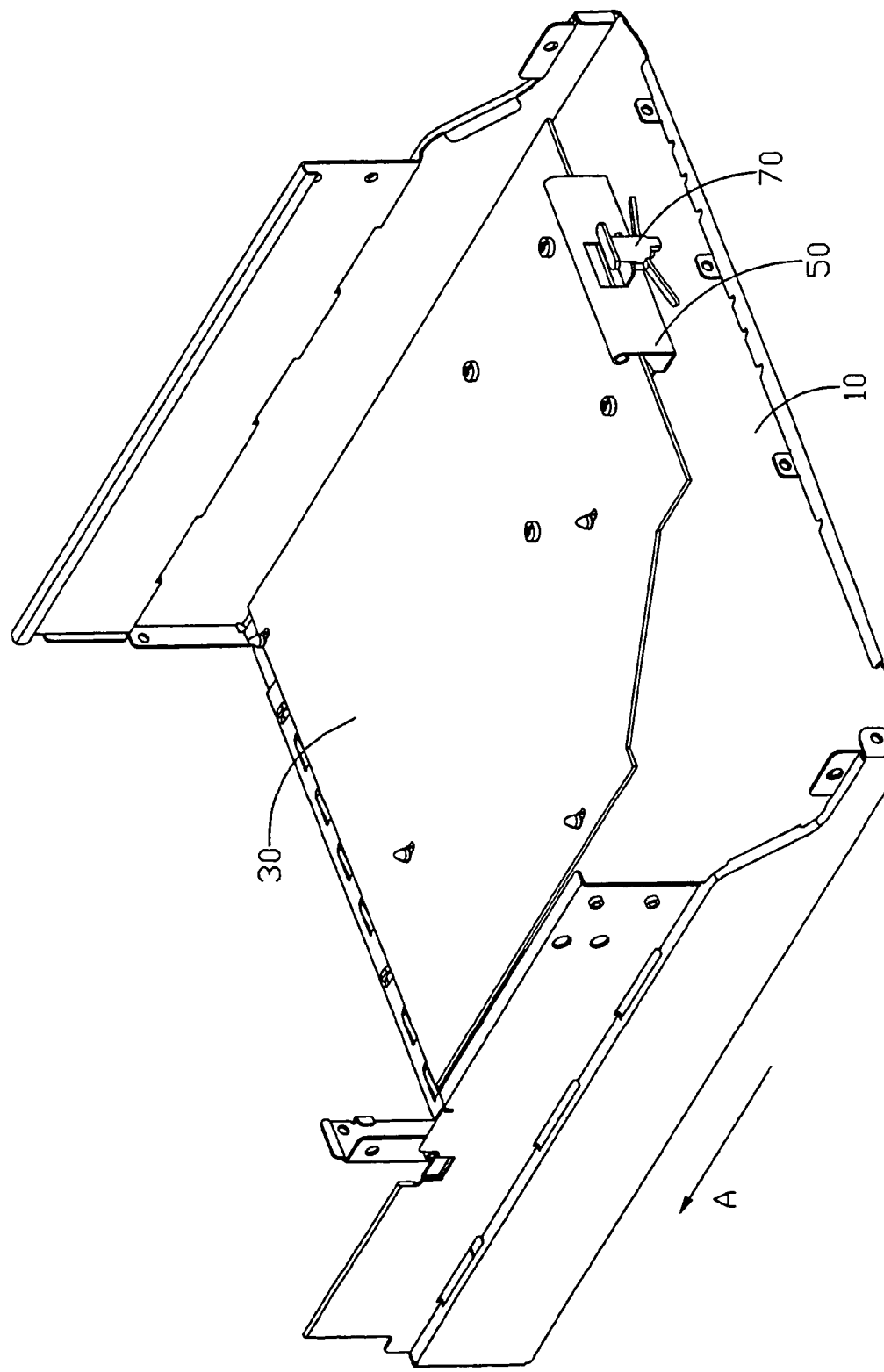
FIG. 6 is an assembled view of the mounting apparatus and the motherboard of FIG. 1, showing the motherboard in a locked state.
Figure 7:
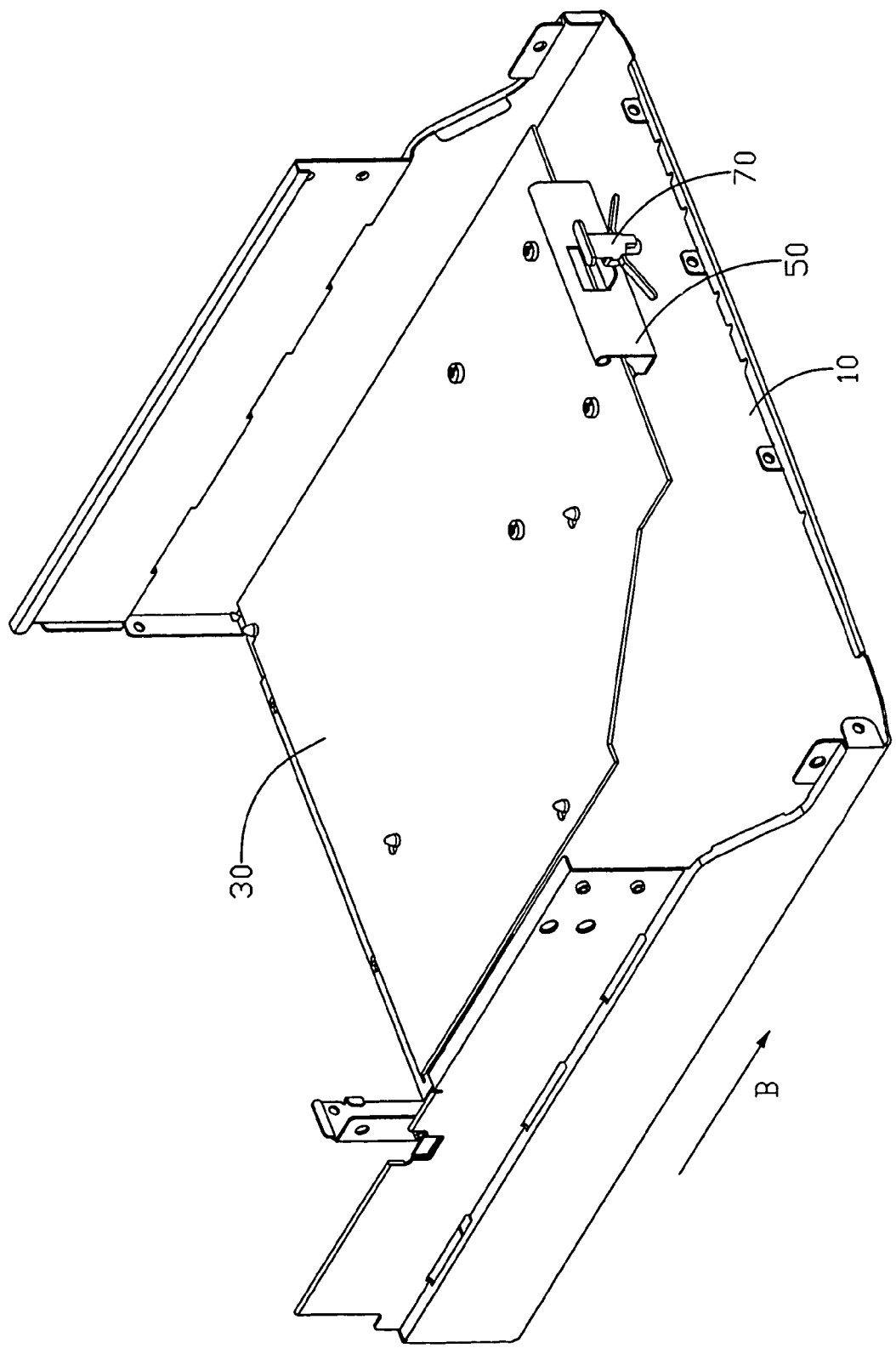
FIG. 7 is similar to FIG. 6, but showing the motherboard in an unlocked state.

Referring to FIGS. 1, 3, and 4, the fixing member 70 is mounted to the post 24 of the chassis 10. The fixing member 70 has a main body 72. An extending portion 74 protrudes from a back portion of the main body 72. A pair of resilient feet 76 extends from a bottom of the main body 72. An engaging portion 82 is formed on a front portion of the main body 72. An inclined guiding portion 78 is formed on an upper portion of the engaging portion 82. A through hole 84 is defined in a center of the main body 72, for receiving the post 24 of the chassis 10. An annular protrusion 842 projects from a middle of the hole 39. A diameter of an inner hole surrounded by the protrusion 842 is smaller than that of a screw cap 862 of a screw 86 (see FIG. 5).

Referring to FIGS. 1 and 3, the supporting tray 50 is partially mounted below the motherboard 30. The supporting tray 50 has a main portion 52, and a side portion 62 extending upwards from an end of the main portion 52. Four protruding portions 54 project from four corners of the main portion 52, respectively. Each protruding portion 51 defines a threaded hole 55 corresponding to the through hole 31 of the motherboard 30. A bulge 56 protrudes from a center of the main portion 52 for supporting the motherboard 30. A pair of second mounting holes 58 is defined in the main portion 52 and located at opposite sides of the bulge 56. Each second mounting hole 58 is also generally calabash-shaped. The second mounting hole 58 has a second narrow portion 582, and a second broad portion 584. A diameter of the narrow portion 582 is smaller than that of the cap portion 222 of the fastener 22, and the diameter of the cap portion 222 of the fastener 22 is smaller than that of the broad portion 584. The side portion 62 defines a cutout 68 in a middle portion thereof. A slice 66 projects from a lower portion of the cutout 68. The slice 66 defines a recess 662 at an end thereof for receiving the engaging portion 82 of the fixing member 70.

Referring to FIGS. 1–6, in assembly, the post 24 of the chassis 10 is received in the hole 84 of the fixing member 70. The screw 86 is threadedly received in the threaded hole 242 of the post 24, so that the fixing member 70 is movably mounted to the bottom wall 12 of the chassis 10. The screw 552 are threadedly received in the corresponding threaded holes 55 of the supporting tray 50 through the holes 31 of the motherboard 30, the motherboard 30 is thus engaged with the supporting tray 50. The standoffs 18 of the chassis 10 are received in the corresponding first broad portions 34 of the first mounting holes 33 of the motherboard 30. The fasteners 22 are received in the second broad portion 584 of the second mounting hole 58 of the supporting tray 50. The slice 66 of the supporting tray 50 abuts against the guiding portion 78 of the fixing member 70. When the motherboard 30 is depressed, the slice 66 of the supporting tray 50 slides downwardly along the guiding portion 78. The supporting tray 50 applies force on the fixing member 70 to cause the feet 76 to deform elastically. The fixing member 70 applies opposite force on the supporting tray 50 to cause the motherboard 30 and the supporting tray 50 to move along the direction of an arrow "A". When the recess 662 of the supporting tray 50 abuts against the engaging member 82 of the fixing member 70, the standoffs 18 are received in the corresponding first narrow portions 36 of the motherboard 30, and the fasteners 22 are received in the corresponding second narrow portions 582 of the supporting tray 50. Simultaneously, each foot 76 of the fixing member 70 comes back its original position, with the recess 662 still abutting against the engaging member 82 of the fixing member 70. Thus, the motherboard 30 together with the supporting tray 50 is assembled to the chassis 10. In this position, the motherboard is in a locked state.

Referring to FIGS. 1–6, in removal of the motherboard 30 from the chassis 10, the fixing member 70 is pressed by exerting force on the extending portion 74 to cause each foot 76 of the fixing member 70 to deform elastically. The recess 662 is disengaged from the engaging member 82 of the fixing member 70. The motherboard 30 is moved along the direction of an arrow "B" by pulling the side portion 64 of the supporting tray 50. The standoffs 18 move to the first broad portions 34 of the motherboard 30, respectively. The fasteners 22 move to the second broad portions 584 of the supporting tray 50, respectively. Thus, the motherboard 30 together with the supporting tray 50 is disengaged from the chassis 10. In this position, the motherboard 30 is defined in an unlock state.

The feet 76 of the fixing member 70 can be replaced by other resilient members such as a spring placed around the post 24 of the chassis 10.

While a preferred embodiment in accordance with the present invention have been shown and described, equivalent modifications and changes known to persons skilled in the art according to the spirit of the present invention are considered within the scope of the present invention as defined in the appended claims.

What is claimed is:

1. A mounting apparatus for mounting a circuit board defining a plurality of first mounting holes, the mounting apparatus comprising:
    a chassis comprising a plurality of standoffs received in the first mounting holes of the circuit board respectively;
    a fixing member mounted to the chassis and movable along a post arranged on the chassis, the fixing member comprising an engaging portion, a slanted guiding portion, and at least one resilient member abutting against the chassis; and
    a supporting tray attached to the circuit board, the supporting tray comprising a side portion projecting from an end thereof, a slice protrudes from the side portion; wherein
    when the circuit board is pressed downwardly, the slice of the supporting tray slides downwardly along the guiding portion, the circuit board is moved in a first direction to a lock position, and the engaging portion of the fixing member abuts against the slice of the supporting tray; when the fixing member is pressed downwardly to cause the engaging portion of the fixing member to disengage from the slice of the supporting tray, the circuit board is capable of moving along a second direction to an unlocked state.

2. The mounting apparatus as described in claim 1, wherein said resilient member comprises a pair of feet extending from a bottom of the fixing member, the slanted guiding portion is formed on an upper portion of the engaging portion.

3. The mounting apparatus as described in claim 1, wherein each of the first mounting holes has a narrow portion and a broad portion, each of the standoffs comprises a cylindrical base portion, a generally conically shaped upper end portion, and an intermediate neck portion, a diameter of the end portion is smaller than that of the broad portion, and is greater than that of the narrow portion.

4. The mounting apparatus as described in claim 1, wherein the fixing member defines a hole in a center thereof for receiving the post.

5. The mounting apparatus as described in claim 4, wherein the post projects upwardly from the chassis and defines a threaded hole in an upper portion thereof, a screw is threadedly received in the threaded hole.

6. The mounting apparatus as described in claim 1, wherein a recess is defined in the slice, for engaging with the engaging portion.

7. The mounting apparatus as described in claim 1, wherein a pair of fasteners project from the chassis, the supporting tray defines a pair of second mounting holes engaging with the fasteners respectively.

8. A circuit board mounting apparatus assembly comprising:

a circuit board defining at least one first mounting hole therein;

a chassis for mounting the circuit board, a post and at least one standoff arranged on a bottom wall of the chassis;

a fixing member slidably mounted to the post, the fixing member comprising a first engaging portion and a slanted guiding portion at an upper portion of the engaging portion; and a supporting member attached to the circuit board, the supporting member comprising a second engaging portion, and a handle portion; wherein the circuit board is placed downwardly so that said standoff enters said first mounting hole for one end, the second engaging portion of the supporting member moves along the slanted guiding portion, the circuit board is thereby moved in a first direction until said standoff abuts against the other end of said first mounting hole of the circuit board, the second engaging portion abuts against the first engaging portion to prevent the circuit board to be moved in a second direction that is opposite to the first direction.

9. The circuit board mounting apparatus assembly as described in claim 8, wherein said fixing member further comprises a pair of resilient feet extending from a bottom thereof.

10. The circuit board mounting apparatus assembly as described in claim 8, wherein said first mounting hole has a broad portion at said one end and a narrow portion at said other end, said standoff comprises a cylindrical base portion, a generally conically shaped upper end portion, and an intermediate neck portion, a diameter of the end portion is smaller than that of the broad portion, and is greater than that of the narrow portion.

11. The circuit board mounting apparatus assembly as described in claim 8, wherein the fixing member defines a hole in a center thereof for receiving the post.

12. The circuit board mounting apparatus assembly as described in claim 11, wherein the post projects upwardly from the chassis and defines a threaded hole in an upper portion thereof, a screw is threadedly received in the threaded hole.

13. The circuit board mounting apparatus assembly as described in claim 8, wherein the second engaging portion comprises a slice protrudes from a side portion of the supporting tray, the slice defines a recess at an end thereof, for engaging with the first engaging portion.

14. The circuit board mounting apparatus assembly as described in claim 8, wherein a pair of fasteners project from the chassis, the supporting tray defines a pair of second mounting holes engaging with the fasteners respectively.

15. A mounting apparatus for mounting a circuit board to a chassis of an electronic device, comprising:

a fixing member installed in said chassis beside said circuit board and resiliently movable along a first direction, and having a first engaging portion formed therefrom; and a supporting member attached to said circuit board and movable together therewith, said supporting member being movable with said circuit board along a second direction different from said first direction between a first position where said circuit board is fixedly installed to said chassis and a second position where said circuit board is removable from said chassis, said supporting member comprising a second engaging portion, and engagement of said first and second engaging portions used to urge said circuit board moving from said second position to said first position, and movement of said fixing member along said first direction resulting in disengagement of said first and second engaging portions so as to allow said circuit board movable from said first position to said second position.

16. The mounting apparatus as described in claim 15, wherein said first direction is perpendicular to said second direction.

17. The mounting apparatus as described in claim 15, wherein said first engaging portion protrudes from said fixing member toward said circuit board in said first position, and said second engaging portion is a slice projecting from said supporting member.

* * * * *